(12) United States Patent
Pendse et al.

(10) Patent No.: US 7,868,468 B2
(45) Date of Patent: Jan. 11, 2011

(54) WIRE BONDING STRUCTURE AND METHOD THAT ELIMINATES SPECIAL WIRE BONDABLE FINISH AND REDUCES BONDING PITCH ON SUBSTRATES

(75) Inventors: Rajendra D. Pendse, Fremont, CA (US); Byung Joon Han, Singapore (SG); HunTeak Lee, Kyongki-do (KR)

(73) Assignee: STATS ChipPAC Ltd., Singapore (SG)

( * ) Notice: Subject to any disclaimer, the term of this patent is extended or adjusted under 35 U.S.C. 154(b) by 476 days.

(21) Appl. No.: 11/839,020

(22) Filed: Aug. 15, 2007

(65) Prior Publication Data

US 2007/0273043 A1 Nov. 29, 2007

Related U.S. Application Data

(63) Continuation-in-part of application No. 11/273,635, filed on Nov. 14, 2005, now Pat. No. 7,453,156.

(60) Provisional application No. 60/627,650, filed on Nov. 12, 2004.

(51) Int. Cl.
*H01L 23/48* (2006.01)
*H01L 21/44* (2006.01)

(52) U.S. Cl. ............... 257/784; 257/737; 257/E23.024; 257/E21.509; 438/617

(58) Field of Classification Search ............... 257/784, 257/773, 786, E23.024, E21.509; 438/617
See application file for complete search history.

(56) References Cited

U.S. PATENT DOCUMENTS

| | | | |
|---|---|---|---|
| 4,521,476 A * | 6/1985 | Asai et al. ................ 428/209 |
| 4,742,023 A | 5/1988 | Hasegawa |
| 5,007,576 A * | 4/1991 | Congleton et al. ......... 228/103 |
| 5,328,079 A | 7/1994 | Mathew et al. |
| 5,329,157 A | 7/1994 | Rosotker |
| 5,340,770 A | 8/1994 | Allman et al. |
| 5,444,303 A | 8/1995 | Greenwood et al. |
| 5,465,899 A | 11/1995 | Quick et al. |
| 5,561,086 A | 10/1996 | Rostoker |
| 5,578,981 A * | 11/1996 | Tokuda ...................... 336/171 |
| 5,654,585 A | 8/1997 | Nishikawa |
| 5,686,762 A | 11/1997 | Langley |
| 5,734,559 A | 3/1998 | Banerjee et al. |
| 5,735,030 A | 4/1998 | Orcutt |
| 5,818,144 A | 10/1998 | Kim |
| 5,904,288 A | 5/1999 | Humphrey |
| 5,960,262 A | 9/1999 | Torres et al. |
| 5,976,964 A * | 11/1999 | Ball ........................... 438/613 |
| 5,994,169 A | 11/1999 | Lamson et al. |
| 6,008,532 A | 12/1999 | Carichner |

(Continued)

*Primary Examiner*—Nitin Parekh

(57) ABSTRACT

A semiconductor package has a semiconductor die disposed on a substrate. A bond wire is connected between a first bonding site on the semiconductor die and a second bonding site on the substrate. The first bonding site is a die bond pad; the second bonding site is a stitch bond. The second bonding site has a bond finger formed on the substrate, a conductive layer in direct physical contact with the bond finger, and a bond stud coupled to the bond wire and in direct physical contact with the conductive layer to conduct an electrical signal from the semiconductor die to the bond finger. The bond finger is made of copper. The conductive layer is made of copper or gold. The bond stud is made of gold and overlies a side portion and top portion of the copper layer.

9 Claims, 7 Drawing Sheets

U.S. PATENT DOCUMENTS

| | | | |
|---|---|---|---|
| 6,008,542 A | 12/1999 | Takamori | |
| 6,114,239 A * | 9/2000 | Lake et al. | 438/653 |
| 6,137,168 A | 10/2000 | Kirkman | |
| 6,158,647 A | 12/2000 | Chapman et al. | |
| 6,165,887 A * | 12/2000 | Ball | 438/613 |
| 6,194,786 B1 | 2/2001 | Orcutt | |
| 6,294,830 B1 | 9/2001 | Fjelstad | |
| 6,329,278 B1 | 12/2001 | Low et al. | |
| 6,333,562 B1 | 12/2001 | Lin | |
| 6,359,341 B1 | 3/2002 | Huang et al. | |
| 6,420,256 B1 | 7/2002 | Ball | |
| 6,462,414 B1 | 10/2002 | Anderson | |
| 6,495,773 B1 | 12/2002 | Nomoto et al. | |
| 6,541,848 B2 | 4/2003 | Kawahara et al. | |
| 6,561,411 B2 | 5/2003 | Lee | |
| 6,624,059 B2 | 9/2003 | Ball | |
| 6,713,881 B2 | 3/2004 | Umehara et al. | |
| 6,787,926 B2 | 9/2004 | Chen et al. | |
| 6,815,836 B2 | 11/2004 | Ano | |
| 6,849,931 B2 | 2/2005 | Nakae | |
| 6,927,479 B2 | 8/2005 | Ramakrishna | |
| 6,956,286 B2 | 10/2005 | Kuzawinski et al. | |
| 7,005,752 B2 * | 2/2006 | Bojkov et al. | 257/786 |
| 7,190,060 B1 * | 3/2007 | Chiang | 257/686 |
| 7,375,978 B2 | 5/2008 | Conner et al. | |
| 7,665,652 B2 * | 2/2010 | Mis et al. | 228/180.5 |
| 2002/0177296 A1 * | 11/2002 | Ball | 438/617 |
| 2003/0015784 A1 | 1/2003 | Liaw et al. | |
| 2003/0057559 A1 * | 3/2003 | Mis et al. | 257/762 |
| 2003/0089521 A1 | 5/2003 | Lee et al. | |
| 2004/0152292 A1 | 8/2004 | Babinetz et al. | |
| 2005/0133928 A1 | 6/2005 | Howard et al. | |
| 2006/0049523 A1 | 3/2006 | Lin | |
| 2006/0102694 A1 | 5/2006 | Lee et al. | |
| 2006/0113665 A1 | 6/2006 | Lee et al. | |

* cited by examiner

WIRE BONDING STRUCTURE AND METHOD THAT ELIMINATES SPECIAL WIRE BONDABLE FINISH AND REDUCES BONDING PITCH ON SUBSTRATES

CROSS-REFERENCE TO RELATED APPLICATION

The present invention is a continuation-in-part application of and claims priority from U.S. patent application Ser. No. 11/273,635, filed Nov. 14, 2005, now U.S. Pat. No. 7,453,156, which claims priority from U.S. provisional application 60/627,650, filed Nov. 12, 2004.

FIELD OF THE INVENTION

The present invention relates in general to semiconductor devices and, more particularly, semiconductor devices with a wire bonding structure that eliminates the requirement for a wire bonding finish and reduces bonding pitch on substrates.

BACKGROUND OF THE INVENTION

Semiconductor devices are found in many products used in modern society. Semiconductors find applications in consumer items such as entertainment, communications, and household items markets. In the industrial or commercial market, semiconductors are found in military, aviation, automotive, industrial controllers, and office equipment.

The manufacture of semiconductor devices begins with formation of a wafer having a plurality of die. Each die contains hundreds or thousands of transistors and other electrical devices for performing one or more electrical functions. For a given wafer, each die from the wafer performs the same electrical function. Front-end manufacturing generally refers to formation of the transistors on the wafer. Back-end manufacturing refers to cutting or singulating the finished wafer into the individual die and then packaging the die for structural support and environmental isolation.

The package has external metal contacts for propagating electrical signals into and out of the die. The die has a number of bonding pads which are connected to the external contacts of the package by wire bonds. Wire bonding provides an electrical interconnect between the semiconductor device and other circuitry external to the semiconductor package. The wire bonds are used to make connections between pads at the active surface of the die and bond sites on a lead frame or bond fingers on the substrate.

Wire bonding typically involves an electrolytic plating process that uses a plating buss to apply a layer of gold (bout 0.5 microns) over a layer of nickel (about 5-10 microns). Unfortunately, the plating buss occupies space, which is problematic in high density designs. In addition, the plating buss causes undesirable parasitic effects and requires another processes step to remove the buss. It is desirable to eliminate the nickel-based electroplating process and platting buss from the wire bonding requirements.

SUMMARY OF THE INVENTION

In one embodiment, the present invention is a semiconductor package comprising a substrate and a semiconductor die disposed on the substrate. A bond wire is connected between a first bonding site on the semiconductor die and a second bonding site on the substrate. The second bonding site has a bond finger formed on the substrate, a copper layer in direct physical contact with the bond finger, and a bond stud coupled to the bond wire and in direct physical contact with the copper layer to conduct an electrical signal from the semiconductor die to the bond finger.

In another embodiment, the present invention is a semiconductor package comprising a substrate and a semiconductor die disposed on the substrate. A bond wire is connected between a first bonding site on the semiconductor die and a second bonding site on the substrate. The second bonding site has a bond finger formed on the substrate, a conductive layer in direct physical contact with the bond finger, and a bond stud coupled to the bond wire and in direct physical contact with the conductive layer to conduct an electrical signal from the semiconductor die to the bond finger.

In another embodiment, the present invention is a semiconductor package bonding site comprising a bond wire, a bond finger, a conductive layer in contact with the bond finger, and a bond stud coupled to the bond wire and in direct physical contact with the conductive layer to conduct an electrical signal.

In another embodiment, the present invention is a method of making a semiconductor package comprising the steps of forming a substrate, disposing a semiconductor die on the substrate, and connecting a bond wire between a first bonding site on the semiconductor die and a second bonding site on the substrate. The step of connecting the bond wire includes forming a bond finger on the substrate, forming a conductive layer in direct physical contact with the bond finger, and forming a bond stud coupled to the bond wire and in direct physical contact with the conductive layer to conduct an electrical signal from the semiconductor die to the bond finger.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices begins with the formation of a wafer having a plurality of die. Each die contains hundreds or thousands of transistors and other electrical devices for performing one or more electrical functions. For a given wafer, each die from the wafer performs the same electrical function. Front-end manufacturing generally refers to formation of the transistors on the wafer. Back-end manufacturing refers to cutting or singulating the finished wafer into the individual die and then packaging the die for structural support and environmental isolation.

The package has external metal contacts for propagating electrical signals into and out of the die. The die has a number of bonding pads which are connected to the external contacts of the package by wire bonds. Wire bonding provides an electrical interconnect between the semiconductor device and other circuitry external to the semiconductor package. The wire bonds are used to make connections between pads at the active surface of the die and bond sites on a lead frame or bond fingers on the substrate.

Figure 1:
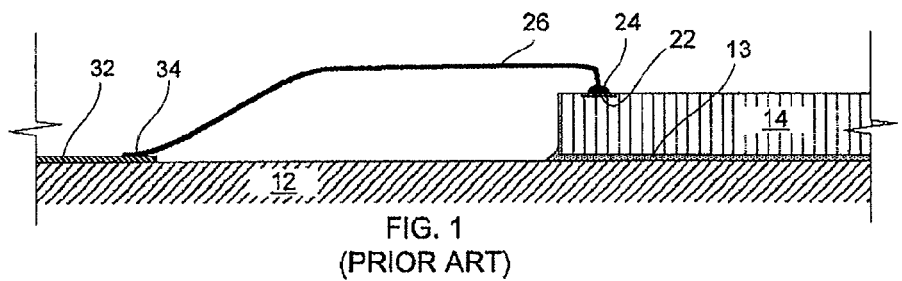
FIG. 1 (PRIOR ART) illustrates a semiconductor die affixed to a substrate, having a known forward wire bond interconnection between the die and substrate.

In FIG. 1 (PRIOR ART), there is shown a conventional wire bond interconnect. A semiconductor die 14 is mounted active side upward upon a die attach surface of substrate 12 and affixed using die attach adhesive 13. The active side of die 14 is provided with interconnect pads 22. Substrate 12 includes at least one layer of a dielectric material and at least one patterned metal layer. A metal layer in the die attach side of substrate 12 is patterned to provide appropriate circuit traces, including bond fingers 32. The die 14 is electrically interconnected with the circuitry on substrate 12 by wire 26 formed between die pad 22 and bond finger 32.

Wire bond 26 is formed using machinery including a capillary bonding tool, a support for the device to be wire-bonded, a source of heat, a source and transducer to impart ultrasound vibration to the capillary bonding tool, and automated control for coordinating the movement and function of these machinery elements. A wire, typically of aluminum or gold, is carried in the lumen of the capillary, and the machinery controls the movement of the wire through the tip of the capillary. To form a wire bond as shown for example in FIG. 1 (PRIOR ART), the die is affixed to the substrate, and then the die and substrate are mounted on the support stage. The support is provided by heating the substrate and die. The capillary is poised over the die and substrate, and a wire is fed through the capillary lumen so that it projects to a selected extent from the capillary tip.

To form the ball bond, an electric arc is struck to form a molten ball at the projecting end of the wire. The capillary moved over the die and substrate so that the tip is aligned in the x-y plane over the target bonding site, e.g., the die pad. Tension is drawn on the wire to pull the ball back into a chamfer in the capillary tip as the capillary is lowered to bring the ball into contact with the target bonding site. The capillary is moved in the "z"-direction to press the ball against the bonding site, and the transducer is activated to impart an ultrasonic vibration to the capillary. The capillary tip, and in particular the chamfer which grips the ball, imparts a vibration to the ball as it is compressed against the target. A metallurgic bond is formed between the ball and target, completing the ball bond.

To form the wire loop, the wire is fed through the capillary, which is raised away from the target, and then moved in a controlled path in relation to the die and substrate toward a position where it is aligned in the x-y plane over the second target bonding site to control the eventual shape of the completed wire bond.

To form a stitch bond to bond finger 32, the capillary is lowered to press the wire against the bonding finger site, and again the transducer is activated to impart a vibration to the wire as it is squashed against the target site, forming a metallurgic bond between the wire and target site. The capillary is moved along the bond site, and is then raised, forming a tail of wire projecting from the capillary tip. Finally, the wire is gripped as the capillary is raised further, causing the wire to break near the second bond and leaving the tail of wire projecting from the capillary tip, ready for formation of a subsequent ball by electric arc at the wire end.

Figure 2A:
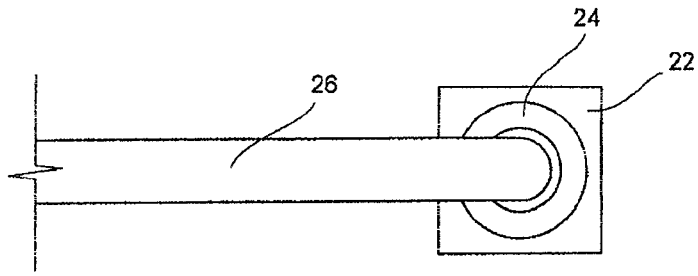
FIG. 2A (PRIOR ART) illustrates a conventional forward wire bond interconnection as in FIG. 1 (PRIOR ART), showing a first bond of the wire to a pad on the die.
Figure 2B:
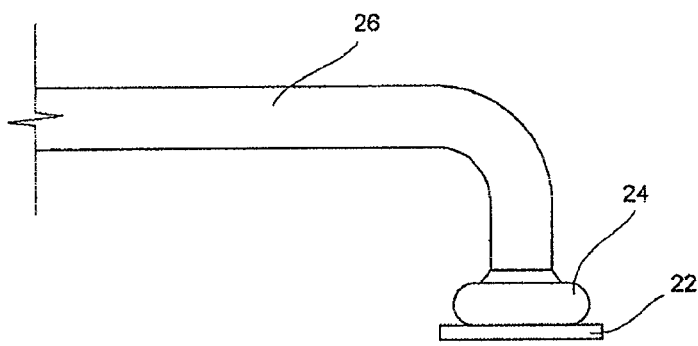
FIG. 2B (PRIOR ART) illustrates a conventional first bond as in FIG. 2A (PRIOR ART)
Figure 3A:
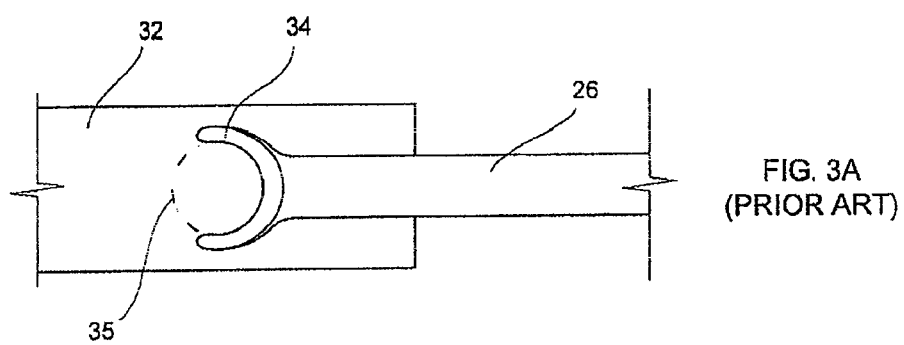
FIG. 3A (PRIOR ART) illustrates a conventional forward wire bond interconnection as in FIG. 1 (PRIOR ART), showing a second bond of the wire to a bond finger on the substrate.

The ball bond is shown in two views at FIGS. 2A (PRIOR ART) and 2B (PRIOR ART), and the stitch bond is shown in two views at FIGS. 3A (PRIOR ART) and 3B (PRIOR ART). The completed ball bond includes a compressed ball 24 metallurgically bonded to die pad 22. The completed stitch bond includes a squashed wire end 34 metallurgically bonded to a flat or pad on bond finger 32. A residue of the wire can remain in place on the pad, as indicated by area 35. As will be appreciated, some variation in the shapes of the bonds will be expected, depending on other things upon the shape and dimensions of the capillary tip and upon various other process parameters. Particularly, some variation in the stitch bond may result from the use of given machinery and processing parameters, owing to the fact that the wire is broken to complete the bond.

As is shown particularly in FIG. 3A (PRIOR ART), the bond finger or bond pad typically has at the bond site a generally flat landing surface, sometimes termed a "flat," on which the bond is formed, which is significantly wider than the completed stitch bond formed upon it, as discussed above.

The process described above is often referred to as a forward wire bonding process, by contrast with a reverse wire bonding process. In a reverse wire bonding process, the ball bond is formed on the lead finger flat or pad, and the stitch bond is formed on the die pad. It may be advisable where a reverse wire bonding process connects a substrate with a die, to raise the second end of the wire, near the stitch bond, to avoid contact of the wire with the active surface of the die. Accordingly in a reverse wire bonding process a ball may be formed on the die pad, upon which the stitch bond is formed. Such a procedure is shown in U.S. Pat. No. 6,561,411.

Figure 4:
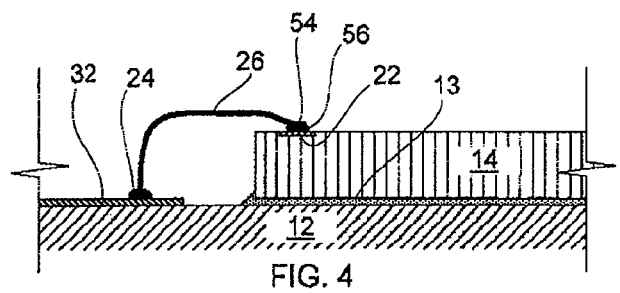
FIG. 4 (PRIOR ART) illustrates a semiconductor die affixed to a substrate, having a known reverse wire bond interconnection between the die and substrate.
Figure 5:
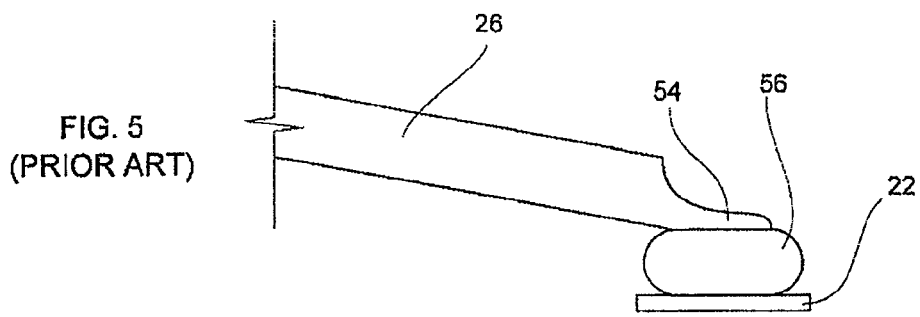
FIG. 5 (PRIOR ART) illustrates a conventional second bond of the wire on a ball on the die pad.
Figure 6A:
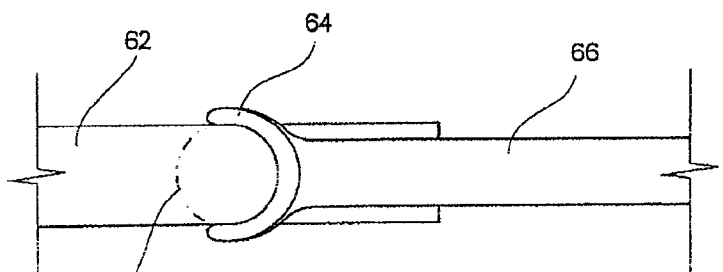
FIG. 6A illustrates a forward wire bond interconnection as in FIG. 1 (PRIOR ART), showing a properly aligned second bond of the wire to a narrow bond finger on the substrate.
Figure 6B:
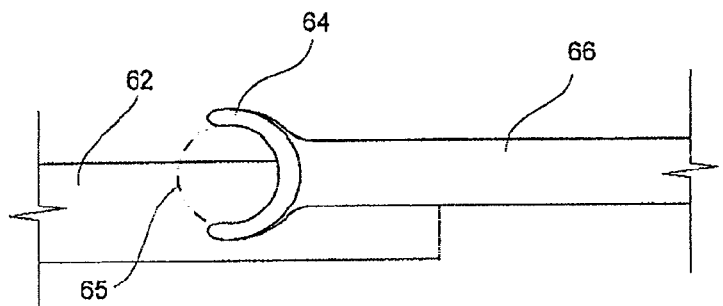
FIG. 6B illustrates a forward wire bond interconnection as in FIG. 1 (PRIOR ART), showing a second bond of the wire misaligned to a narrow bond finger on the substrate.

An illustrative example of a reverse wire bond interconnect is shown in FIG. 4 (PRIOR ART). As in the forward wire bond example of FIG. 1 (PRIOR ART), a semiconductor die 14 is mounted active side upward upon a die attach surface of substrate 12 and affixed there using a die attach adhesive 13. The active side of die 14 is provided with interconnect pads 22. Substrate 12 includes at least one layer of a dielectric material and at least one patterned metal layer. A metal layer in the die attach side of substrate 12 is patterned to provide appropriate circuit traces, including bond fingers 32. The die 14 is electrically interconnected with the circuitry on substrate 12 by wire 26 formed between die pads 22 and bond fingers 32. In the reverse wire bond configuration, ball bond 24 is formed on a flat or pad of bond finger 32 and stitch bond 54 is formed on pedestal 56 formed as a ball previously deposited on die pad 22. Stitch bond 54 formed on pedestal 56, which in turn is formed on die pad 22, is shown in further detail in FIG. 5.

Where forward wire bonding is employed, it might be possible in principle to make the pitch of the interconnections on the substrate smaller by reducing the width of the bonding sites. Proper alignment and consequences of misalignment of a stitch bond with a narrower bond finger are illustrated in FIGS. 6A and 6B. Here, the bond finger is narrower than the stitch bond and may be compared to the diameter of the compressed ball in a ball bond made using the same capillary.

Where the alignment is sufficiently precise, as illustrated in an ideal case in FIG. 6A, the stitch bond may be acceptably robust. Here, there may be a sufficiently good metallurgic bond between portion 64 of the second wire end 66 and the narrow bond finger 62, although this may depend upon the extent to which the flattened remnant of the flattened wire outlined by broken line 65, whose form may be unreliable, may aid in providing a good conductive interconnection.

Where the alignment is less than perfect, as illustrated in FIG. 6B, the second bonding process can fail to make a good connection with bond finger 62. It is uncertain what the configuration of the resulting portion 66 of wire end 66 and of residue 65 of the second bonding process may be, but, in any event, a consistent or reliable or robust bond cannot be suitably assured. Accordingly, trying to reduce lead finger pitch by narrowing the flat width on the lead finger is generally not acceptable.

Figure 3B:
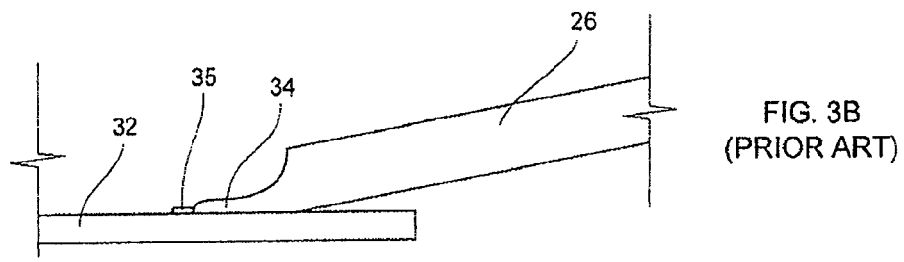
FIG. 3B (PRIOR ART) illustrates a conventional second bond as in FIG. 3A (PRIOR ART)

The bond finger is narrow at the stitch bond site, a pedestal is formed on the narrow bond site, and the stitch bond is formed on the pedestal. The pedestal can be formed as a ball in the manner of forming a stud bump. That is, wire bonding apparatus is employed to form a ball on the narrow bond finger as if forming a ball bond interconnection, but then, instead of drawing the wire to form a loop, the wire is clamped as the capillary is moved upward, so that the wire breaks off just above the ball, leaving a tail. The top of the ball, including the wire tail, may be flattened by coining to form a generally flattened surface before the stitch bond is formed. The stitch bond is formed generally as described above with reference to FIGS. 3A and 3B, except that the stitch bond is formed upon the flattened surface of pedestal 72 rather than on the flat landing surface of bond finger 32. The completed stitch bond includes a squashed wire end 74 metallurgically bonded to pedestal 72, and a residue of the wire can remain in place on the pad, as indicated in area 75. Some variation in the shapes of the first and second bonds will be expected, depending on other things upon the shape and dimensions of the capillary tip and upon various other process parameters. Particularly, some variation in the appearance of the second bond may result from the use of given machinery and processing parameters, owing to the fact that the wire is broken to complete the bond.

Figure 7A:
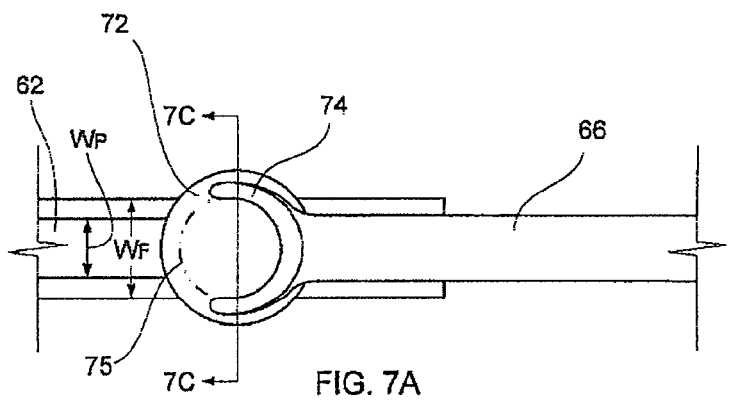
FIG. 7A illustrates a forward wire bond interconnection to a narrow bond finger, showing a second bond of the wire to a pedestal on a narrow bond finger on the substrate.
Figure 7B:
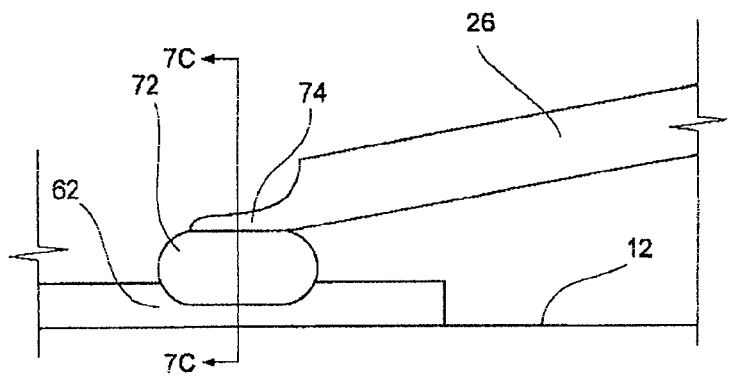
FIG. 7B illustrates the second bond as in FIG. 7A.
Figure 7C:
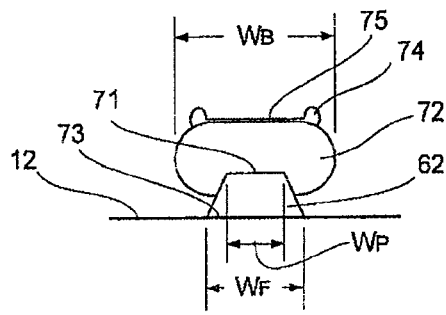
FIG. 7C illustrates the second bond as in FIGS. 7A, 7B in a sectional view at 7C-7C.
Figure 7D:
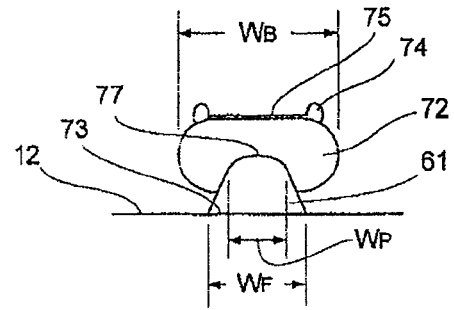
FIGS. 7D-7E illustrate sectional views of various narrow bond finger configurations.
Figure 7E:
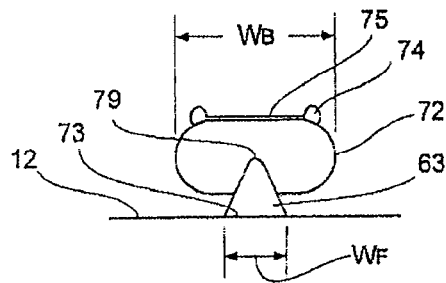

A resulting second bond is shown in FIGS. 7A and 7B. A narrow bond site 62 on a lead finger has a generally trapezoidal, or roughly triangular or truncated, or roughly triangular cross section with a rounded apex, see FIGS. 7C-7E. Where the bond site part 62 of the lead finger has a generally trapezoidal cross section, with a roughly flat top, the width WP of flat top 71 of the bond finger at the bond site is less than the width WB of support pedestal 72. Usually, the width WF of base 73 of the bond finger at the bond site, which is somewhat larger than the width WP of flat top 71, is also less than the width WB of support pedestal 72. Typically, top 71 of the bond site part of the bond finger is not perfectly flat and the edges are not sharply defined. As is illustrated in FIG. 7D, top 77 of the bond site part of the bond finger may be rounded. The top of the bond site part of the bond finger is narrower than the pedestal diameter, and the process of forming support pedestal 72 on the bond site part of the bond finger causes the ball to deform around the lead finder at the bond site. Thus, the bond finger may be made proportionately much narrower than the pedestal diameter WB and, as illustrated in FIG. 7E, the bond finger at the bond site may be narrowed so that the cross sectional shape is nearly triangular, as illustrated for example in FIG. 7E, with an apex 79. As the sectional views in FIGS. 7C-7E show, whether the lead finger at the bond site has a generally flat or rounded plateau, or has sharp or rounded apex, support pedestal 72 conforms to the shape of the plateau or apex; that is, as the support pedestal is formed, it conforms to at least the upper part of at least one of the sides of the lead finger. The support pedestal is precisely aligned with the bond site during its formation, so that it is symmetrically disposed upon the lead finger and, accordingly, parts of the pedestal have been equally deformed on the two sides of the lead finger. It is not necessary that the support pedestal be perfectly aligned, and in practice the deformation may be asymmetrical to some extent. Moreover, as illustrated for example in FIG. 8, where the lead finger is sufficiently thin in the "z"-direction, parts of support pedestal 82 may touch the surface of substrate 12 alongside the base of lead finger 63. The robust electrical connection can be formed between a ball and a comparatively narrow bond site part of the lead finger, and that a stitch bond 75 can be reliably formed upon support pedestal 72, 82 so formed, as illustrated in FIGS. 7C-7E and 8.

Inasmuch as the wire length and substrate area depend upon the lead finger bond pitch, reduction of the bond pitch can result in significant shortening of wire lengths and reduction of substrate area.

As may be appreciated, the feature width may vary among the various leads and lead fingers on the substrate, and may vary along the length of a given lead or lead finger, the lead finger is less than the support pedestal diameter at the bond site, that is, at the place along the length of the lead where the support pedestal is formed; the trace may be narrower or wider at other points, so long as the desired lead finger density and lead finger bond pitch is obtained.

Figure 9A:
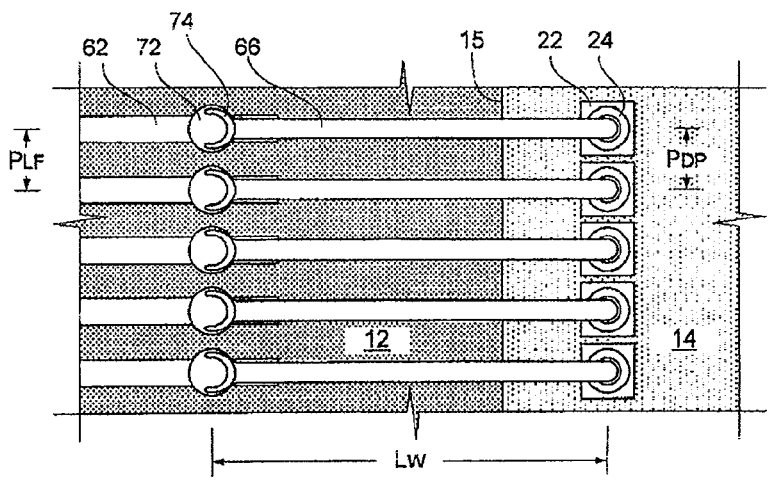
FIGS. 9A-9B illustrate a high density interconnection of a die to a substrate.
Figure 9B:
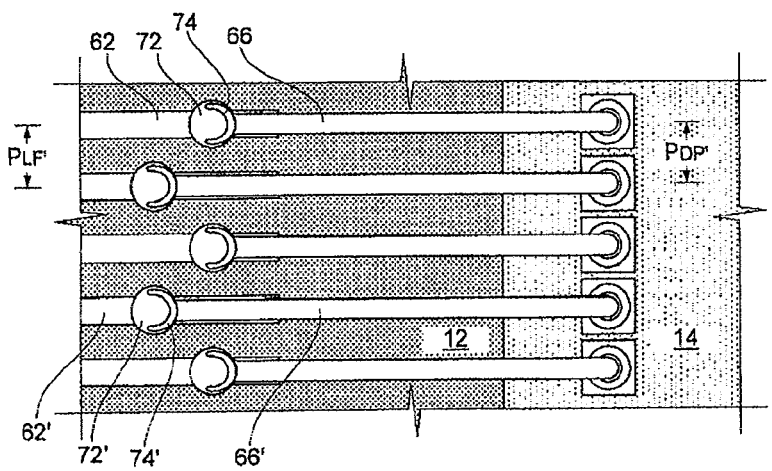

FIGS. 9A and 9B show in plain view two lead finger arrangements in which the die pad pitch PDP is the same as the lead finger bond pitch PLF, so that the wires run parallel, rather than fanning out, as they must where the lead finger bond pitch is greater than the die pad pitch. Such an arrangement is sometimes termed "orthogonal," and it provides for minimal wire length and substrate area. Die pads 22 are arrayed in a row along an edge 15 of die 14. Lead fingers 62, narrowed at the bond sites, are arranged in the die attach surface of substrate 12 in a row, with the bond fingers generally aligned with the corresponding die pads. A support pedestal, i.e., 72 in FIG. 9A and 72 and 72' in FIG. 9B, is formed at the lead finger bond site on each lead finger; in FIG. 9A the support pedestals are arranged in a single line, while in FIG. 9B they are arranged in two staggered rows. The arrangement of FIG. 9B provides a greater distance between nearest support pedestals while maintaining the same pitch, see die pad pitch PDP' and lead finger bond pitch PLF'.

Figure 10A:
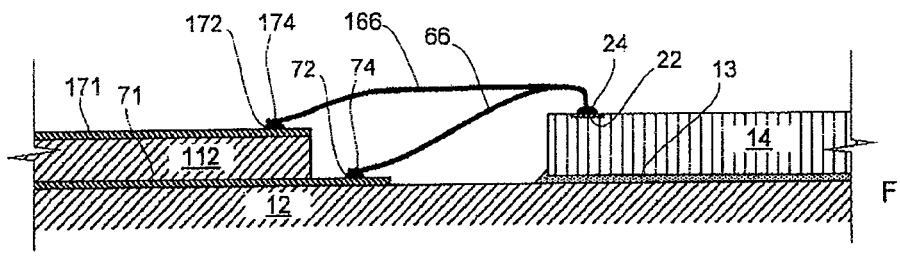
FIGS. 10A-10B illustrate a high density interconnection of a die to a tiered substrate.
Figure 10B:
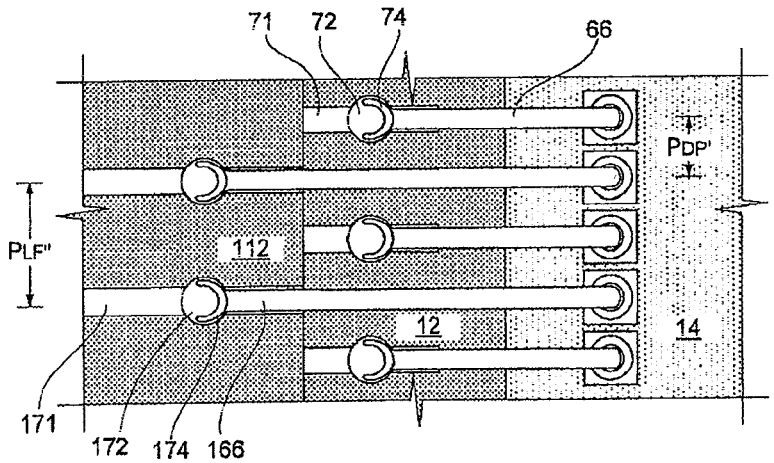

Referring to FIGS. 10A and 10B, wire bonds are formed between the die pads and respective bond fingers, by forming a ball bond 24 on die pad 22, drawing wire 66 (166) to the respective lead finger 71 (171) bond site, and forming a stitch bond 74 (174) on support pedestal 72 (172), as described with reference to FIGS. 7A-7E and 8.

Figure 8:
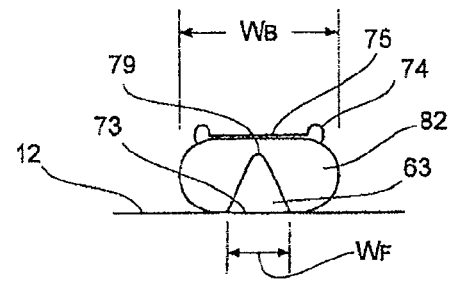
FIG. 8 illustrates the second bond in a sectional view.

In practice, even where the lead finger width at the bond site is minimized as shown in FIGS. 7E and 8, practical processing technology limitations constrain the extent to which the separation between adjacent lead fingers can be minimized. Using standard processing, a separation of about 40 m may be a practical minimum. Where the die pad pitch is very fine, such as 50 m or less, it may not be possible to obtain orthogonal wire bonding in an arrangement such as is shown in FIG. 9A or 9B. To obtain orthogonal wire bonding where the die pad pitch is very fine, a tiered substrate, as is illustrated in FIGS. 10A and 10B, can be used. Here, as in FIGS. 9A, 9B, the die pads are arranged in a row along an edge of die 14. Lead fingers having narrow bond sites 62 are arranged in the die attach surface of a lower substrate 12 in a first row, with the lead fingers generally aligned with corresponding alternating ones (first, third, fifth, etc.) of the die pads; and lead fingers having narrow bond sites 62' are arranged in a surface of an upper substrate 112 in a second row, with the lead fingers generally aligned with alternating ones (second, fourth, sixth, etc.) of the die pads not corresponding lead fingers in the first substrate. The edge of the upper substrate is set back so that the bond sites on the lead fingers on the lower substrate are exposed.

A first row of support pedestals 72 are formed at the exposed lead finger bond sites of lead fingers 71 on the lower tier of substrate 112, and a second row of support pedestals 172 are formed at the lead finger bond sites of lead fingers 171 on the upper tier of substrate 112. Wire bonds are formed between the die pads 22 and the respective bond fingers, alternately 71, 171, by forming a ball bond 24 on die pad 22, drawing wire 66, 166 to the respective lead finger 71, 171 bond site, and forming stitch bond 74, 174 on support pedestal 72, 172, as described with reference to FIGS. 7A-7E and 8. The lead finger bond pitch PLF''' in both the lower and the upper rows of lead fingers is twice as great as the die pad pitch PDP'. A fine lead finger bond pitch, in the range between about 80 m and about 100 m can be obtained in each of the rows of lead fingers, and because the lead fingers in the two rows are staggered, the combined effective lead finger bond pitch is half as great as in each row, which can provide for orthogonal wire bond interconnection of a die having a pad pitch in a range as small as about 40 m and about 50 m, and wire lengths as short as 1 mm or shorter can be possible.

Figure 11A:
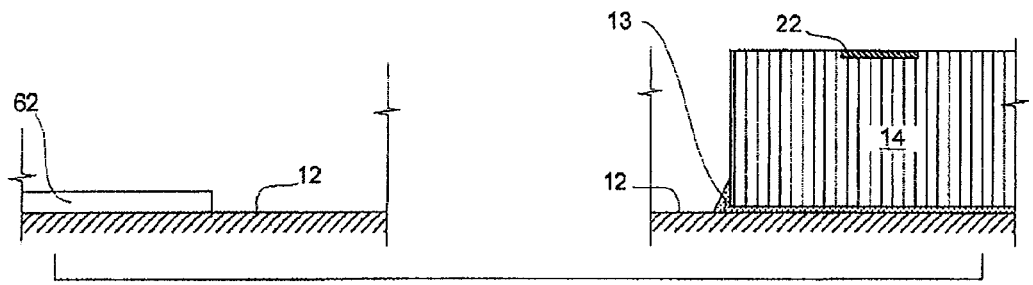
FIGS. 11A-11D illustrate a sectional view showing steps in the formation of first and second interconnection of a die with a substrate.
Figure 11B:
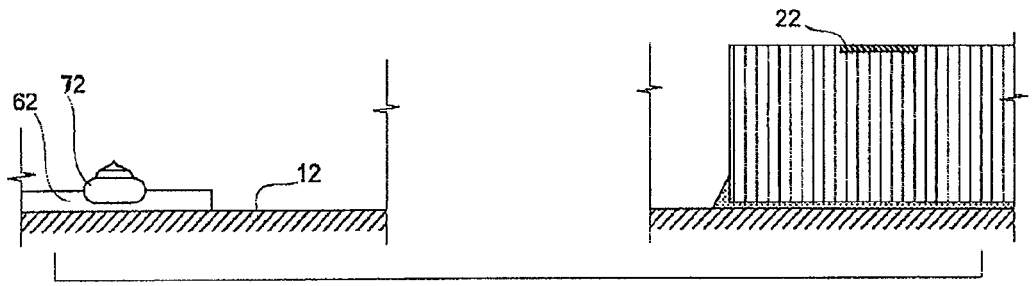
Figure 11C:
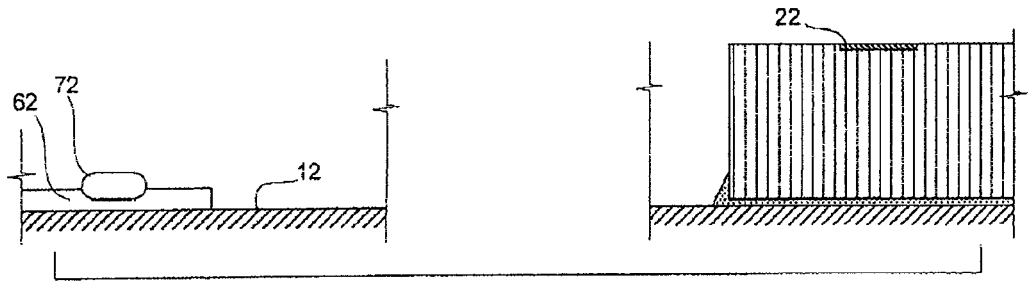
Figure 11D:
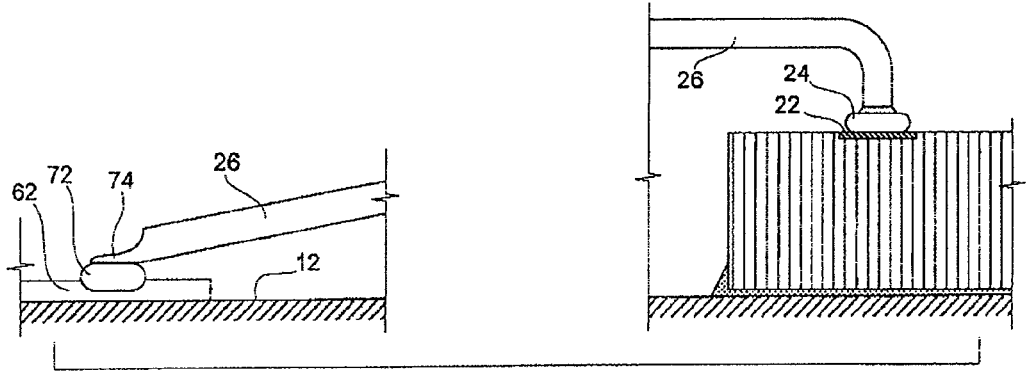

Stages in a generalized process for making a wire bind interconnect are illustrated in FIGS. 11A-11D. FIG. 11A shows a stage in which die 22 mounted using die attach adhesive 13 on a die attach side of substrate 12 is provided. Electrical interconnect pads 22 are situated in the active side of the die. Lead fingers having narrow bond sites 62 are patterned in a metal layer in the substrate. Using wire bond apparatus, a ball 72 is formed by a stud bumping procedure on the bond site of lead finger 62, as shown in FIG. 11B. The ball is then flattened by coining to form a support pedestal 72 at the bond site on the lead finger as shown in FIG. 11C. The ball bond 24 is formed on die pad 22, wire 26 is drawn to the bond site on lead finger 62, and stitch bond 74 is formed on support pedestal 72.

Figure 12A:
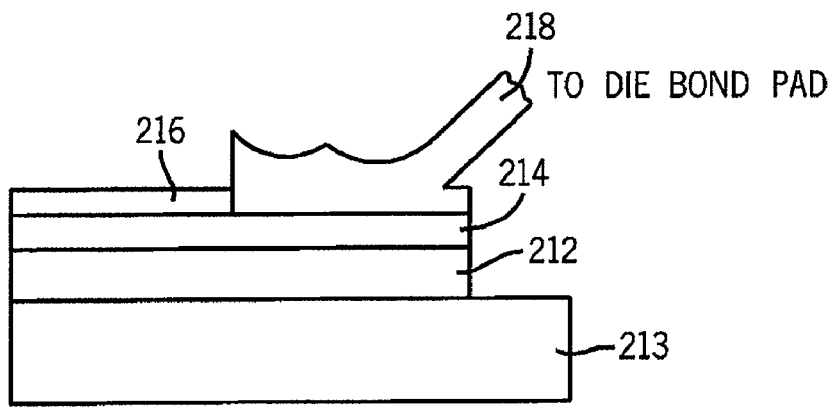
FIGS. 12A (PRIOR ART) and 12B (PRIOR ART) illustrate side and cross-sectional views of a conventional wire bond to a lead finger with intermediate copper, nickel and gold layers.
Figure 12B:
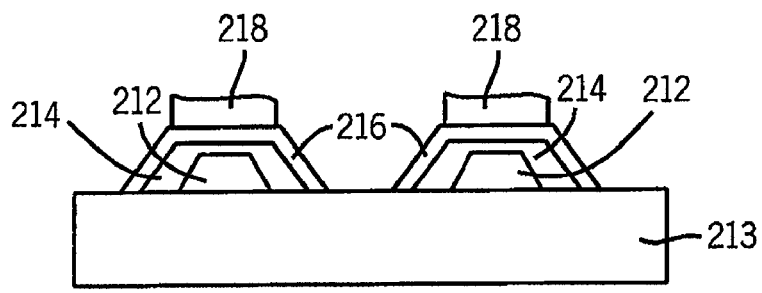

FIG. 12A (PRIOR ART) illustrates a side view of a conventional stitch bond. Copper (Cu) layer 212 is formed on lead finger 213. A nickel (Ni) layer 214 is formed on Cu layer 212 by an electroplating process. A gold (Au) layer 216 is formed on Ni layer 214 by electroplating. Gold wire bond 218 is connected to Au layer 216 to make the electrical contact between the die bond pad and lead finger 213. FIG. 12B (PRIOR ART) shows a cross-sectional view of the stitch bond. The Cu layer 212, Ni layer 214, and Au layer 216 are formed by electroplating over the adjacent layer and each make contact with lead finger 213. The conventional wire bonding requires electrolytic Ni and Au plating on the Cu surface to form the stitch bond. Alternatively, the stitch bond uses another finish like silver (Ag) or Palladium (Pd) over the Cu layer.

The above stitch bond requires additional manufacturing steps to plate the Ni layer, or other finish like silver (Ag) or palladium (Pd) over the Cu layer to render the surface wire bondable. The stitch bond requires a plating buss for the plating process, which must be later removed. The Ni layer increases the bond finger pitch by plating the side walls and forming stubs which remain from the plating buss. It is desirable to eliminate electrolytic nickel-gold plating as well as the plating buss from the wire bonding process to reduce manufacturing steps, space requirements, bonding finger pitch, and parasitic effects.

Figure 13:
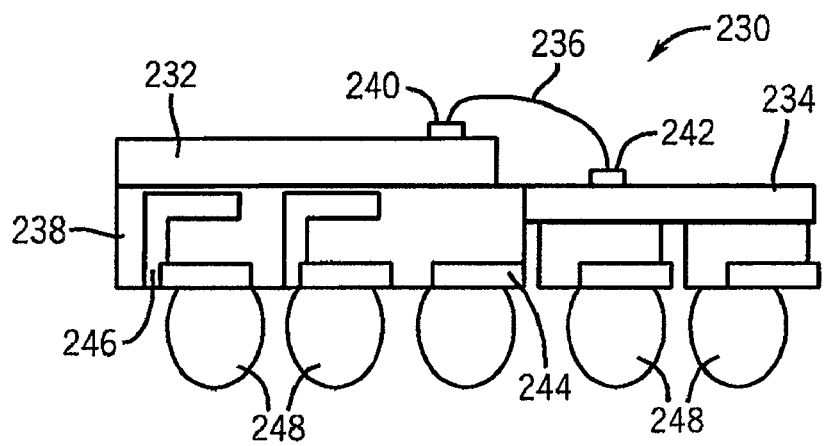
FIG. 13 illustrates a semiconductor package with a semiconductor die affixed to a substrate, having a wire bond interconnection between the die and substrate.

In FIG. 13, a semiconductor device 230 is shown having a wire bond electrical interconnect 236 between semiconductor die 232 and bond finger 234. Bond finger 234 is made of copper. Wire bond 236 makes electrical connection between active devices on semiconductor die 232 and bond finger 234. Semiconductor die 232 is mounted a surface of substrate 238 using a die attach adhesive. A first interconnect pad 240 is formed on the active-device side of die 232. A second interconnect pad 242 is formed on bond finger 234. Wire bond 236 provides an electrical connection between pads 240-242. Bond finger 234 makes electrical contact with solder balls 248 through conductive vias 244. Semiconductor die 232 can also make electrical contact with solder balls 248 through conductive vias 246.

Figure 14A:
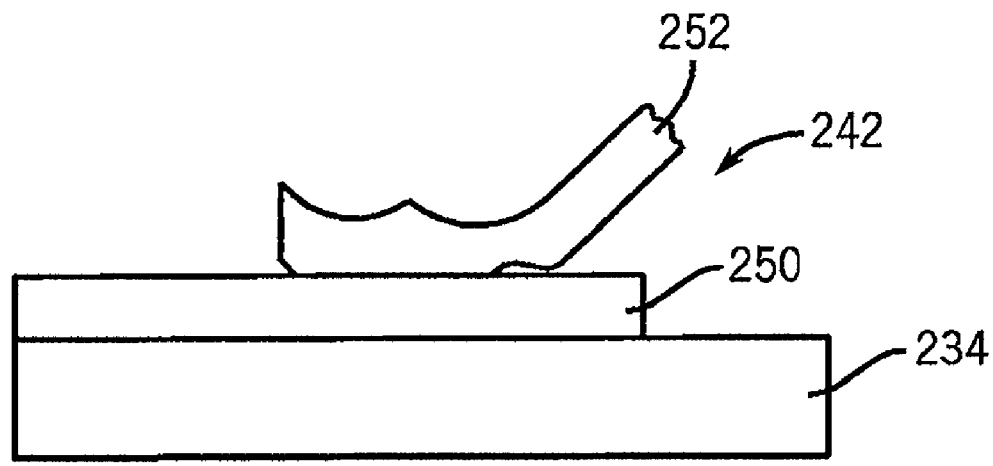
FIGS. 14A-14B illustrate side and cross-sectional views of a wire bond to a lead finger with a gold layer in direct physical contact with a copper layer.
Figure 14B:
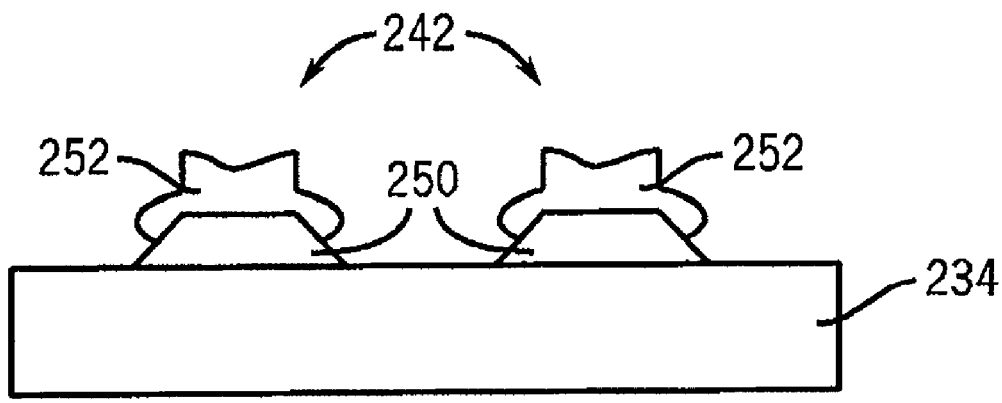

Further detail of interconnect pad 242 is shown in FIGS. 14A and 14B. In FIG. 14A, copper layer 250 is formed on bond finger 234. A gold stitch bond stud 252 is then directly connected to a bare copper layer 250 without the need for intermediate plating layers or other treatment to render the surface of bond finger 234 bondable. Alternatively, stitch bond stud 252 can be directly connected to an immersion gold layer or glass passivation coating. FIG. 14B illustrates a side view of stitch bond stud 252 directly connected to copper layer 250, which is formed on bond finger 234.

While bonding to bare copper layer 250 remains the preferred embodiment, it remains an option in some cases to add a very thin protective finish to bond finger 234, although not by electroplating. The protective finish may be tin (Sn), Au, Ni, Pd, or combination thereof, deposited by an electroless or immersion process, which still avoids the need for a plating buss. The protective finish can also be an oxide layer, which is deposited as a thin film or grown on the copper surface. For example, the oxide can be black oxide or indium tin oxide (ITO). The thickness of the protective finish is 0.005-0.05 microns.

Nonetheless, the direct application of stitch bond stud 252 on copper layer 250 remains the optimal solution and eliminates the plating tie bars on the substrate, which frees up real estate for routing and prevents electrical parasitics arising from the tie bars and reduces the effective bond finger pitch for wire bonding which could result in shorter wires and smaller package size. The bonding process disclosed herein maximizes density, minimizes final bond finger pitch, and reduces manufacturing costs. The technique is most appealing for laminate substrates; however, it could be applied to leadframes wherein selective Ag plating steps could be eliminated.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor package, comprising:
    a substrate;
    a semiconductor die disposed on the substrate; and
    a bond wire connected between a first bonding site on the semiconductor die and a second bonding site on the substrate, the second bonding site including,
    (a) a bond finger formed on the substrate,
    (b) a copper layer in direct physical contact with the bond finger, and
    (c) a bond stud coupled to the bond wire and in direct physical contact with the copper layer to conduct an electrical signal from the semiconductor die to the bond finger.

2. The semiconductor package of claim 1, wherein the bond finger is made of copper.

3. The semiconductor package of claim 1, wherein the bond stud is made of gold.

4. The semiconductor package of claim 1, wherein the bond stud overlies a side portion and top portion of the copper layer.

5. The semiconductor package of claim 1, wherein the first bonding site includes a die bond pad.

6. The semiconductor package of claim 1, wherein the second bonding site includes a stitch bond.

7. A method of making a semiconductor package, comprising:
    forming a substrate;
    disposing a semiconductor die on the substrate; and
    connecting a bond wire between a first bonding site on the semiconductor die and a second bonding site on the substrate by,
    (a) forming a bond finger on the substrate,
    (b) forming a copper layer in direct physical contact with the bond finger, and
    (c) forming a bond stud coupled to the bond wire and in direct physical contact with the copper layer to conduct an electrical signal from the semiconductor die to the bond finger.

8. The method of claim 7, wherein the copper layer includes a glass passivation coating.

9. The method of claim 7, wherein the copper layer includes an immersion layer of gold.

* * * * *